(12) United States Patent
Yang et al.

(10) Patent No.: US 9,548,472 B2
(45) Date of Patent: Jan. 17, 2017

(54) DISPLAY DEVICE

(71) Applicant: InnoLux Corporation, Jhu-Nan, Miao-Li County (TW)

(72) Inventors: Yi-Xin Yang, Jhu-Nan (TW); Cheng-Hsiung Liu, Jhu-Nan (TW); Fang-Iy Wu, Jhu-Nan (TW); Cheng-Hsu Chou, Jhu-Nan (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 14/873,894

(22) Filed: Oct. 2, 2015

(65) Prior Publication Data

US 2016/0099435 A1    Apr. 7, 2016

(30) Foreign Application Priority Data

Oct. 2, 2014    (TW) .............................. 103134450 A

(51) Int. Cl.
| | | |
|---|---|---|
| *H01L 51/52* | (2006.01) | |
| *H01L 51/00* | (2006.01) | |
| *H01L 25/16* | (2006.01) | |
| *H01L 33/54* | (2010.01) | |
| *H01L 23/498* | (2006.01) | |

(Continued)

(52) U.S. Cl.
CPC ....... *H01L 51/5253* (2013.01); *H01L 23/4985* (2013.01); *H01L 23/5387* (2013.01); *H01L 25/167* (2013.01); *H01L 27/3244* (2013.01); *H01L 33/48* (2013.01); *H01L 33/54* (2013.01); *H01L 33/62* (2013.01); *H01L 51/0097* (2013.01); *H01L 51/50* (2013.01); *H01L 51/5209* (2013.01); *H01L 51/5246* (2013.01);

(Continued)

(58) Field of Classification Search
CPC ............. H01L 2251/5338; H01L 33/62; H01L 51/0097; H01L 27/3244; H01L 33/54; H01L 23/4985; H01L 25/167; H01L 2924/12041; H01L 2924/12044; H01L 51/5246; H01L 23/5387; H01L 33/48; H01L 51/50
See application file for complete search history.

(56) References Cited

U.S. PATENT DOCUMENTS

| | | | | |
|---|---|---|---|---|
| 6,252,299 B1 * | 6/2001 | Masuda | .............. | H01L 23/4951 174/529 |
| 8,836,894 B2 * | 9/2014 | Gu | ....................... | G02B 6/0035 349/65 |

(Continued)

*Primary Examiner* — Bac Au
(74) *Attorney, Agent, or Firm* — Muncy, Geissler, Olds & Lowe, P.C.

(57) ABSTRACT

A display device comprises a first substrate including a first top portion, a first sidewall portion and a first bent portion, a second substrate including a second top portion, a second sidewall portion and a second bent portion, a display element and a packaging material. The first bent portion is disposed between the first top portion and the first sidewall portion. The second substrate is separated from the first substrate by a predetermined distance to form an accommodating space. The second top portion is disposed corresponding to the first top portion. The second bent portion is disposed between the second top portion and the second sidewall portion. The display element is disposed in the accommodating space. The packaging material is disposed in the accommodating space and corresponding to the first sidewall portion and the second sidewall portion.

11 Claims, 5 Drawing Sheets

(51) Int. Cl.
*H01L 51/50* (2006.01)
*H01L 33/48* (2010.01)
*H01L 27/32* (2006.01)
*H01L 33/62* (2010.01)
*H01L 23/538* (2006.01)

(52) U.S. Cl.
CPC .............. *H01L 2251/5338* (2013.01); *H01L 2924/12041* (2013.01); *H01L 2924/12044* (2013.01)

(56) References Cited

U.S. PATENT DOCUMENTS

| | | | |
|---|---|---|---|
| 9,214,640 B2* | 12/2015 | Lee | H01L 51/0097 |
| 2006/0279216 A1* | 12/2006 | Kim | G02B 6/0055 |
| | | | 313/631 |
| 2009/0167171 A1* | 7/2009 | Jung | H01L 51/524 |
| | | | 313/504 |
| 2010/0253902 A1* | 10/2010 | Yamazaki | G02F 1/1303 |
| | | | 349/158 |
| 2011/0050657 A1* | 3/2011 | Yamada | H01L 27/3293 |
| | | | 345/204 |
| 2011/0149204 A1* | 6/2011 | Son | G02B 6/0031 |
| | | | 349/62 |
| 2013/0002572 A1* | 1/2013 | Jin | G02F 1/133305 |
| | | | 345/173 |
| 2014/0104185 A1* | 4/2014 | Hu | G06F 3/041 |
| | | | 345/173 |
| 2014/0226112 A1* | 8/2014 | Kim | G02F 1/133305 |
| | | | 349/96 |
| 2014/0285747 A1* | 9/2014 | Jun | G02F 1/133308 |
| | | | 349/58 |
| 2015/0362652 A1* | 12/2015 | Hayashi | G02B 6/005 |
| | | | 362/607 |

\* cited by examiner

DISPLAY DEVICE

CROSS REFERENCE TO RELATED APPLICATIONS

This Non-provisional application claims priority under 35 U.S.C. §119(a) on Patent Application No(s). 103134450 filed in Taiwan, Republic of China on Oct. 2, 2014, the entire contents of which are hereby incorporated by reference.

BACKGROUND OF THE INVENTION

Field of Invention

This invention relates to a display device.

Related Art

Common display devices encompass liquid crystal display (LCD) devices, electrophoretic display devices, organic light emitting diode (OLED) display devices, etc. Generally, the display device mainly includes a display medium (including an LCD, an electrophoretic display or an OLED display), a substrate and a protection cover, wherein the display is disposed between the substrate and the protection cover. Moreover, a common anti-water/oxygen design in the display device is to dispose a dam seal around the edges of the protection cover and substrate for connecting and sealing the protection cover and substrate, so that the water/oxygen of the environment can be prevented from permeating the display device through the joint between the protection cover and the substrate and the accompanying damage can be thus avoided. However, the above design is unfavorable to the increasingly raised demand for the lightness, thinness and having a larger display area to show a larger image, because the border of the display device will be enlarged, and therefore the display area will be reduced and the appearance of the display device will be unpleasing to the eye.

Although the industry has developed a filling material which is used to comprehensively seal the substrate and the protection cover and covers the display for preventing the water/oxygen from the display, the water/oxygen still can permeate through the joint between the substrate and the protection cover.

Therefore, it is an important subject to provide a display device having a better anti-water/oxygen effect and a narrower border area.

SUMMARY OF THE INVENTION

In view of the foregoing subject, an objective is to provide a display device which is designed novelly to have a better anti-water/oxygen effect and also include a narrower border area.

To achieve the above objective, a display device comprises a first substrate, a second substrate, a display element and a packaging material. The first substrate includes a first top portion, a first sidewall portion and a first bent portion. The first bent portion is extended from an edge of the first top portion and disposed between and connecting the first top portion and the first sidewall portion. The second substrate is separated from the first substrate by a predetermined distance to form an accommodating space and includes a second top portion, a second sidewall portion and a second bent portion. The second top portion is disposed corresponding to the first top portion. The second bent portion is extended from an edge of the second top portion and disposed between and connecting the second top portion and the second sidewall portion. The display element is disposed in the accommodating space. The packaging material is disposed in the accommodating space and corresponding to the first sidewall portion and the second sidewall portion.

In one embodiment, the packaging material is disposed around the display element.

In one embodiment, the first substrate further includes a first extension portion connected to the first sidewall portion, and the second substrate further includes a second extension portion connected to the second sidewall portion and disposed corresponding to the first extension portion, and the first extension portion and the second extension portion are extended along a direction parallel to the first top portion.

In one embodiment, the first extension portion is extended to another edge of the first top portion, and the second extension portion is extended to another edge of the second top portion.

In one embodiment, the length of the second sidewall portion is in a range between 1 mm and 20 mm.

In one embodiment, the display device further comprises a third bent portion and a fourth bent portion. The third bent portion is extended from the first sidewall portion and disposed between the first sidewall portion and the first extension portion. The fourth bent portion is extended from the second sidewall portion and disposed between the second sidewall portion and the second extension portion.

In one embodiment, the packaging material includes a first packaging material and a second packaging material, the extensibility of the first packaging material is greater than that of the second packaging material, the first packaging material is disposed in the accommodating space corresponding to the first bent portion, the first sidewall portion, the third bent portion, the second bent portion, the second sidewall portion and the fourth bent portion, and the second packaging material is disposed in the accommodating space corresponding to the first extension portion and the second extension portion.

In one embodiment, the display device further comprises a third bent portion, a fourth bent portion, a fifth bent portion and a sixth bent portion. The third bent portion is extended from the first sidewall portion. The fourth bent portion is extended from the second sidewall portion. The fifth bent portion is extended from the third bent portion. The sixth bent portion is extended from the fourth bent portion. The third bent portion and the fifth bent portion are disposed between the first sidewall portion and the first extension portion, and the fourth bent portion and the sixth bent portion are disposed between the second sidewall portion and the second extension portion.

In one embodiment, the first top portion and the second top portion are curved structures.

In one embodiment, the curvature radiuses of the first top portion and second top portion are in a range between 10 mm and 1000 mm.

As mentioned above, in the display device of this invention, the first bent portion is formed between the first top portion and the first sidewall portion and the second bent portion is formed between the second top portion and the second sidewall portion, and that is, the first bent portion and the second bent portion collectively form the bent structure. Thereby, the path of the water/oxygen of the environment permeating the accommodating space can be elongated, and that is, the time of the water/oxygen of the environment contacting the display element can be delayed, so as to prevent the display element from being affected by the water/oxygen and damaged and thus to achieve the anti-water/oxygen effect. Besides, through the design of the first bent portion and the second bent portion, the width of the border of the display device can be reduced and the effect of a narrow border region can be provided.

Furthermore, through the design of the first bent portion and the second bent portion, the anti-water/oxygen effect of a certain degree can be achieved when the packaging material is just disposed in the accommodating space and corresponding to the first sidewall portion and the second sidewall portion. Therefore, the packaging material can be saved.

BRIEF DESCRIPTION OF THE DRAWINGS

Those embodiments will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
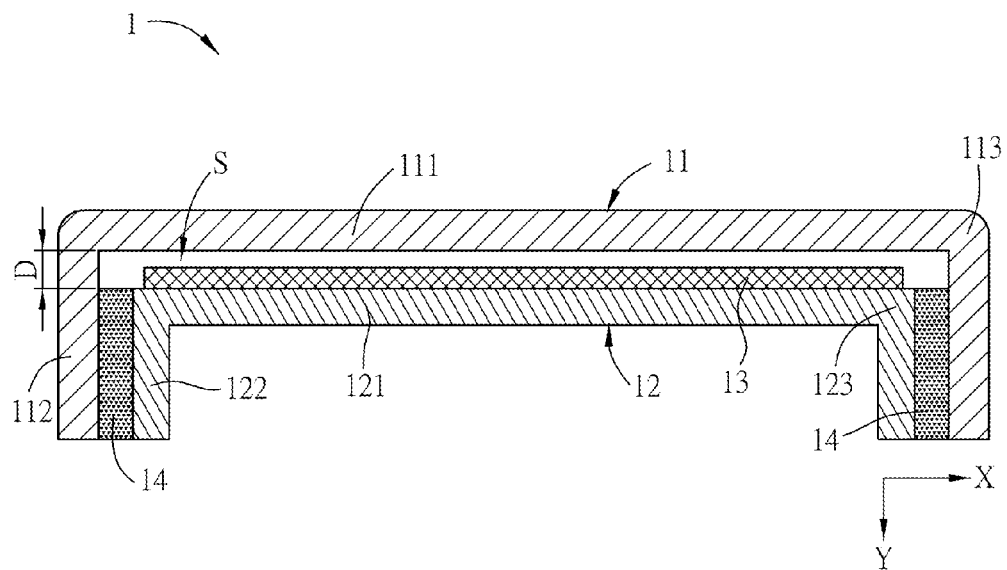
FIG. 1 is a schematic sectional diagram of a display device of an embodiment of the invention.

FIG. 1 is a schematic sectional diagram of a display device 1 of an embodiment of the invention. As shown in FIG. 1, in this embodiment, the display device 1 is, for example but not limited to, an LCD device, an LED display device, an OLED display device or an electrophoretic display device.

The display device 1 of this embodiment includes a first substrate 1, a second substrate 12, a display element 13 and a packaging material 14. The first substrate 11 and the second substrate 12 are separated from each other by a predetermined distance D to form an accommodating space S, and the display element 13 is disposed in the accommodating space S. The display element 13 of this embodiment, according to the type of the above-mentioned display device 1, can be an LCD panel, an LED display panel, an OLED display panel or an electrophoretic display panel, and the OLED display panel will be illustrated as an example below. The first substrate 11 can be a protection cover disposed on a side of the display element 13 and the second substrate 12 can be a substrate of the display element 13. Of course, in other embodiments, the first substrate 11 can be the substrate of the display element 13 and the second substrate 12 can be the protection cover.

The first substrate 11 of this embodiment includes a first top portion 111, a first sidewall portion 112 and a first bent portion 113. The first top portion 111 is extended along a first direction X, the first sidewall portion 112 is extended along a second direction Y, and the first bent portion 113 is bent from the first direction X to the second direction Y so that the first substrate 11 is bent at the joint between the first top portion 111 and the first sidewall portion 112. In other words, the first bent portion 113 is extended from an edge of the first top portion 111 and disposed between and connecting the first top portion 111 and the first sidewall portion 112. The second substrate 12 also includes a second top portion 121, a second sidewall portion 122 and a second bent portion 123. Likewise, the second top portion 121 is extended along the first direction X, the second sidewall portion 122 is extended along the second direction Y, and the second bent portion 123 is bent from the first direction X to the second direction Y and between the second top portion 121 and the second sidewall portion 122. In other words, the second bent portion 123 is extended from an edge of the second top portion 121 and disposed between and connecting the second top portion 121 and the second sidewall portion 122. Since the second top portion 121 is disposed corresponding to the first top portion 111 and the second sidewall portion 122 is disposed corresponding to the first sidewall portion 112, the first bent portion 113 and the second bent portion 123 are both formed into a bent structure.

In detail, the first substrate 11 and the second substrate 12 are separated from each other by a predetermined distance D and disposed oppositely to form the accommodating space S, and favorably, the predetermined distance D can be in a range between 0.1 μm and 5 mm so that the display element 13 is disposed in the accommodating space S and between the first top portion 111 and the second top portion 121. The packaging material 14 of this embodiment is disposed in the accommodating space S and corresponding to the first sidewall portion 112 and second sidewall portion 122, and the packaging material 14 is disposed around the display element 13 to seal the edge of the accommodating space S, so that the display element 13 is disposed in the sealed accommodating space S. The thickness of the display device 1, i.e. the whole thickness of the first substrate 11, second substrate 12 and accommodating space, can be in a range between 0.5 μm and 50 μm. The packaging material 14 of this embodiment can be seal, and can be selected from the group of acrylic thermocuring material, acrylic photocuring material, epoxy resin thermocuring material, epoxy resin photocuring material, silicon thermocuring material, silicon photocuring material and their any mixture. The packaging material 14 is disposed between the first sidewall portion 112 and the second sidewall portion 122 and around the display element 13, so as to prevent the water/oxygen of the environment from permeating the accommodating space S through the edges of the first substrate 11 and second substrate 12 and thus achieve the anti-water/oxygen effect.

Besides, this embodiment can reduce the width of the border of the display device 1 by the design of the first bent portion 113 and second bent portion 123, so as to achieve the effect of a narrower border area. Furthermore, through the design of the first bent portion 113 and second bent portion 123, the anti-water/oxygen effect of a certain degree can be achieved when the packaging material 14 is just disposed in the accommodating space S and corresponding to the first sidewall portion 112 and second sidewall portion 122, and therefore the packaging material 14 can be saved. Of course, in other embodiments, for a better anti-water/oxygen effect, the packaging material 14 may be filled into the accommodating space S, i.e. the whole accommodating space S.

Figure 2:
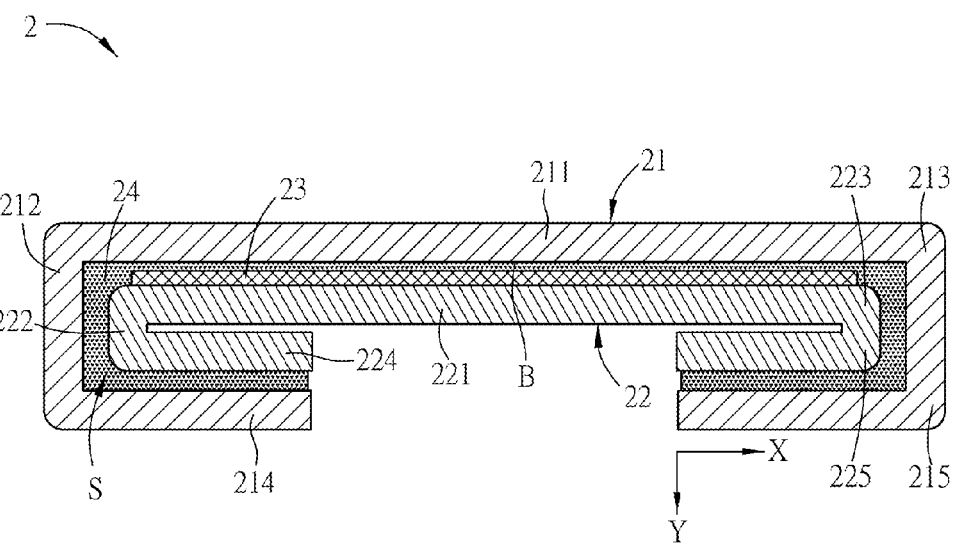
FIG. 2 is a schematic sectional diagram of a display device of another embodiment of the invention.

FIG. 2 is a schematic sectional diagram of a display device 2 of another embodiment of the invention. As shown in FIG. 2, the first substrate 21 of the display device 2 of this embodiment further includes a first extension portion 214. The first extension portion 214 is connected to the first sidewall portion 212 and along the first direction X and therefore formed on a side of the first top portion 211. Physically, in this embodiment, the surface of the first top portion 211 corresponding to the accommodating space S is called the bottom surface B and the first extension portion 214 is formed on the side of the bottom surface B of the first top portion 211. Likewise, the second substrate 22 further includes at least a second extension portion 224. The second extension portion 224 is connected to the second sidewall portion 222 and disposed corresponding to the first extension portion 214. In this embodiment, the first extension portion 214 is extended to another edge of the first top portion 211 and the second extension portion 224 is extended to another edge of the second top portion 221, and the first extension portion 214 and the second extension portion 224 are extended along a direction parallel to the first top portion 211, i.e. the first direction X herein. Moreover, the second extension portion 224 and the first extension portion 214 are disposed on the side of the bottom surface B of the first top portion 211 together. A third bent portion 215 can be formed between the first sidewall portion 212 and the first extension portion 214 and is bent from the second direction Y to the first direction X. A fourth bent portion 225 can be formed between the second sidewall portion 222 and the second extension portion 224 and is bent from the second direction Y to the first direction X.

In other words, the display device 2 of this embodiment further includes the third bent portion 215 and the fourth bent portion 225. The third bent portion 215 is extended from the first sidewall portion 212 and disposed between the first sidewall portion 212 and the first extension portion 214. The fourth bent portion 225 is extended from the second sidewall portion 222 and disposed between the second sidewall portion 222 and the second extension portion 224. The display device 2 of this embodiment includes the first bent portion 213, the second bent portion 223, the third bent portion 215 and the fourth bent portion 225, so that the first extension portion 214 and the second extension portion 224 are formed on the side of the bottom surface B of the first top portion 211. Therefore, the width of the border of the display device 2 can be reduced and the path for the water/oxygen permeating the display device 2 can be elongated.

In this embodiment, the packaging material 24 is filled into the accommodating space S, i.e. the whole accommodating space S, to cover the display element 23. Of course, in other embodiments, the packaging material 24 may be disposed in the accommodating space S and corresponding to the first bent portion 213 and second bent portion 223 or to the third bent portion 215 and fourth bent portion 225, and the anti-water/oxygen effect of a certain degree also can be achieved thereby.

In this embodiment, because the display device 2 includes the first bent portion 213, the second bent portion 223, the third bent portion 215 and the fourth bent portion 225, the path for the water/oxygen of the environment permeating the accommodating space S can be elongated. Physically, the water/oxygen will not cause the damage to the display element 23 until passing through between the third bent portion 215 and the fourth bent portion 225 and then through between the first bent portion 213 and the second bent portion 223, so a better anti-water/oxygen effect can be provided thereby. As mentioned above, the third bent portion 215 and the fourth bent portion 225 can be formed into a right angle favorably, so that the water/oxygen can be gathered at the right angle region when entering into between the first substrate 21 and the second substrate 22, so as to achieve a better anti-water/oxygen effect. Of course, in other embodiments, the third bent portion 215 and the fourth bent portion 225 may be formed into a curved angle, and the anti-water/oxygen effect also can be achieved thereby.

Figure 3:
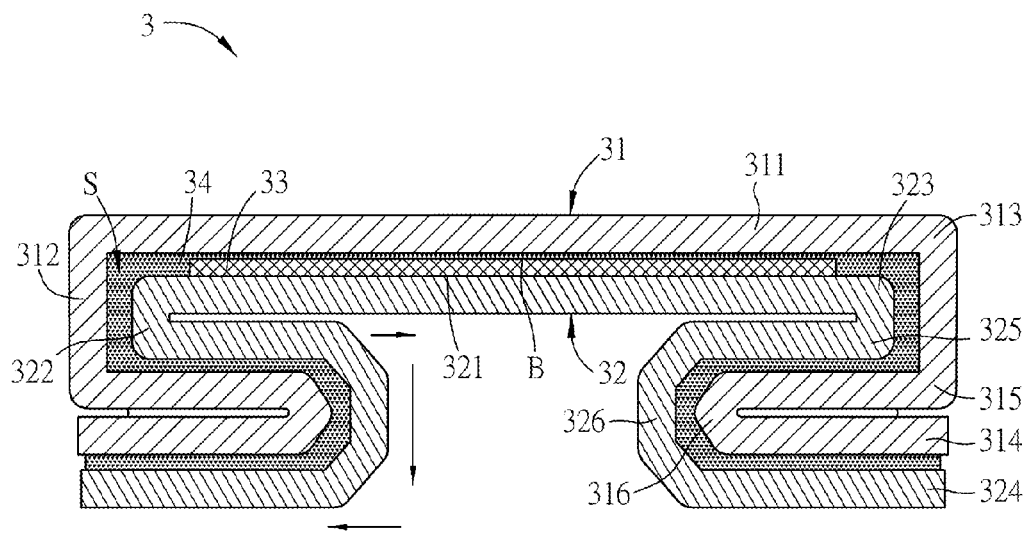
FIG. 3 is a schematic sectional diagram of a display device of another embodiment of the invention.

FIG. 3 is a schematic sectional diagram of a display device 3 of another embodiment of the invention. As shown in FIG. 3, in an embodiment, the first extension portion 314 and the second extension portion 324 can be extended to form a plurality of bent structures, so as to intensify the anti-water/oxygen effect. Physically, the display device 3 of this embodiment further includes a fifth bent portion 316 and a sixth bent portion 326. The fifth bent portion 316 is extended from the third bent portion 315 and disposed between the third bent portion 315 and the first extension portion 314. The sixth bent portion 326 is extended from the fourth bent portion 325 and disposed between the fourth bent portion 325 and the second extension portion 324. In this embodiment, the third bent portion 315 and the fifth bent portion 316 are disposed between the first sidewall portion 312 and the first extension portion 314, and the fourth bent portion 325 and the sixth bent portion 326 are disposed between the second sidewall portion 322 and the second extension portion 324. By taking the first extension portion 314 as an example, the first extension portion 314 of this embodiment is extended from the fifth bent portion 316, then extended along the direction parallel to the first sidewall portion 312 and then extended away from the central part of the first top portion 311. Likewise, the second extension portion 324 is extended from the sixth bent portion 326 in the same bent manner, which is shown as the arrows in FIG. 3. In other words, each of the fifth bent portion 316 and the sixth bent portion 326 is formed into a U-shape structure, which is disposed on the side of the bottom surface B of the first top portion 311. In other embodiments, the first extension portion 314 or the second extension portion 324 can be extended to introduce more bent structures and a better anti-water/oxygen effect can be achieved thereby.

In this embodiment, the fifth bent portion 325 and the sixth bent portion 326 are both disposed on the side of the bottom surface B of the first top portion 311. In other words, the structures of the first extension portion 314 and second extension portion 324 are both disposed on the side of the bottom surface B of the first top portion 311, and thereby the width of the border of the display device 3 can be reduced and the border area can be narrowed. No matter how the first extension portion 314 and the second extension portion 324 are bent, they are disposed on the side of the bottom surface B of the first top portion 311 to bring the effect of narrow border.

Figure 4:
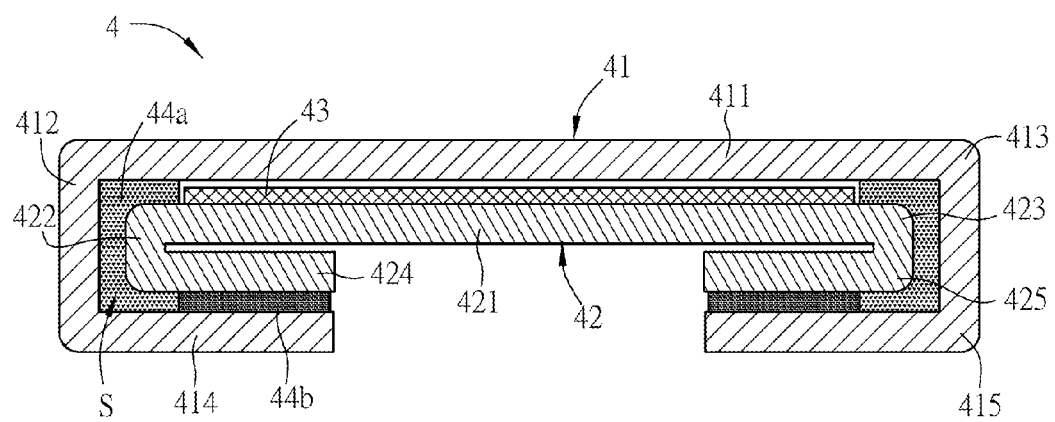
FIG. 4 is a schematic sectional diagram of a display device of another embodiment of the invention.

FIG. 4 is a schematic sectional diagram of a display device 4 of another embodiment of the invention. As shown in FIG. 4, in an embodiment, the accommodating space S can be filled with different packaging materials, such as the first packaging material 44a and the second packaging material 44b included by the packaging material of this embodiment. Physically, the first packaging material 44a and the second packaging material 44b are seal and can be selected from the group of pressure dependant adhesive material, epoxy resin adhesive material, silicon adhesive material and their any mixture. The extensibility of the first packaging material 44a is greater than that of the second packaging material 44b, and the anti-water/oxygen ability of the second packaging material 44b is greater than that of the first packaging material 44a. The first packaging material 44a of this embodiment is disposed in the accommodating space S and corresponding to the first bent portion 314, the first sidewall portion 412, the third bent portion 415, the second bent portion 423, the second sidewall portion 422 and the fourth bent portion 425. The second packaging material 44*b* of this embodiment is disposed in the accommodating space S and corresponding to the first extension portion 414 and the second extension portion 424. In other embodiments, the first packaging material 44*a* or the second packaging material 44*b* may be also disposed between the first top portion 411 and the second top portion 421, so as to intensify the anti-water/oxygen effect for protecting the display element 43. In other words, in this embodiment, the first packaging material 44*a* of higher extensibility is filled into the accommodating space S of the bent structures (such as the first bent portion 413, the second bent portion 423, the third bent portion 415 and the fourth bent portion 425) while the second packaging material 44*b* is filled into the accommodating space S of the relatively flat structure (such as the first extension portion 414 and the second extension portion 424).

Of course, when the first extension portion 414 and the second extension portion 424 form a plurality of bent structures (referring to FIG. 3), the first packaging material 44*a* may be disposed between the fifth bent portion 316 and the sixth bent portion 326 as shown in FIG. 3 and the second packaging material 44*b* may be disposed at the relatively flat structure.

Figure 5A:
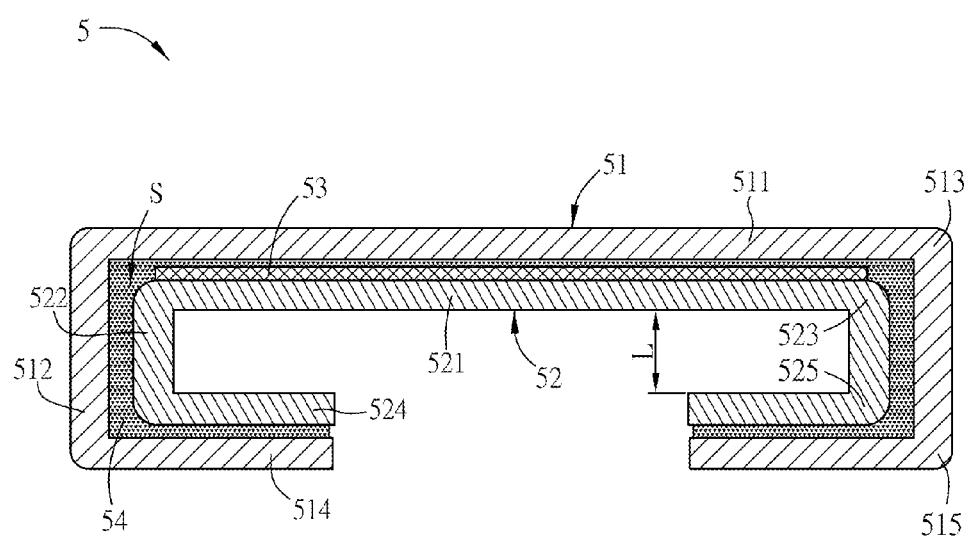
FIG. 5A is a schematic sectional diagram of a display device of another embodiment of the invention.
Figure 5B:
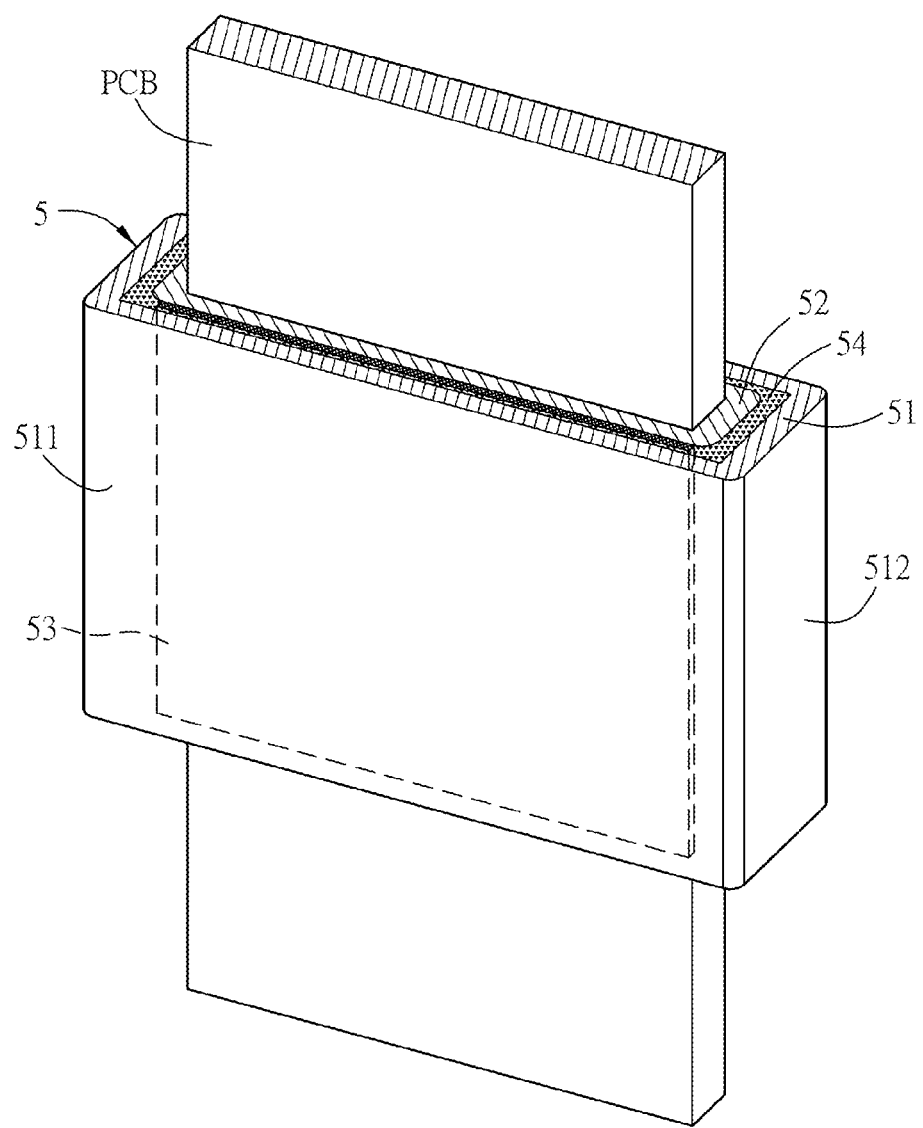
FIG. 5B is a schematic diagram of an application of the display device in FIG. 5A.

FIG. 5A is a schematic sectional diagram of a display device 5 of another embodiment of the invention. As shown in FIG. 5A, in an embodiment, the length L of the second sidewall portion 522 can be increased, and that is, the distance between the first bent portion 513 and the third bent portion 515 and the distance between the second bent portion 523 and the fourth bent portion 525 become longer. Favorably, the length L of the second sidewall portion 522 can be in a range between 1 mm and 20 mm. The length L of the second sidewall portion 522 in this embodiment means the distance from the side of the second top portion 521 away from the accommodating space S to the side of the second extension portion 524 closer to the accommodating space S, as shown in FIG. 5. Through this kind of design, the second top portion 521, the second sidewall portion 522 and the second extension portion 524 can become a structure which is disposed on the opposite side of the accommodating space S and can clip something. FIG. 5B is a schematic diagram of an application of the display device 5 in FIG. 5A. As shown in FIG. 5B, the display device 5 of this embodiment can be disposed to a backlight module or a circuit board PCB, and the circuit board PCB is given as an example. The thickness of the circuit board PCB is less than the length L of the second sidewall portion 522, so that the circuit board PCB can be accommodated on the side of the second top portion 521, second sidewall portion 522 and second extension portion 524 opposite the accommodating space S. Therefore, by increasing the length L of the second sidewall portion 522 of the display device 5 of this embodiment, the circuit board PCB or the backlight module can be disposed among the second top portion 521, the second sidewall portion 522 and the second extension portion 524, so as to save the space for the disposition.

Figure 6A:
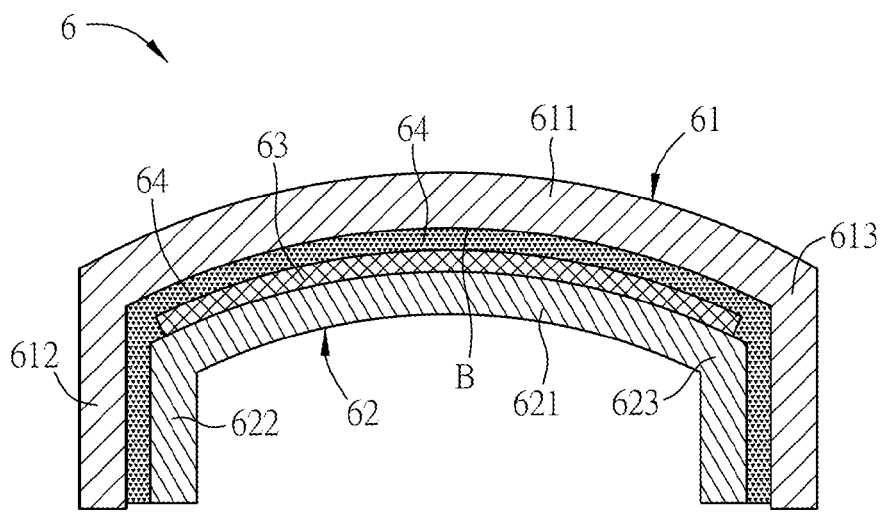
FIG. 6A is a schematic sectional diagram of a display device of another embodiment of the invention.
Figure 6B:
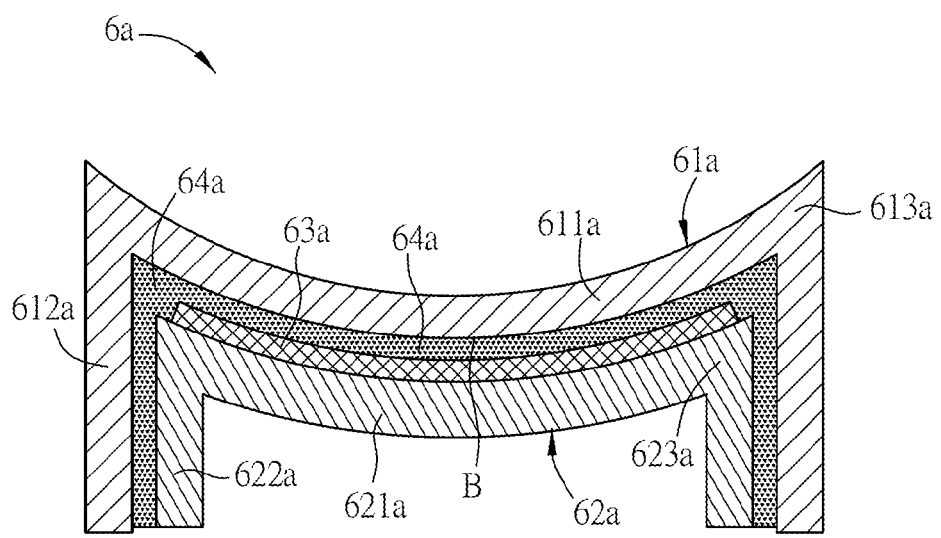
FIG. 6B is a schematic diagram of another embodiment of the display device in FIG. 6A.

FIG. 6A is a schematic sectional diagram of a display device 6 of another embodiment of the invention. As shown in FIG. 6A, in an embodiment, the first top portion 611 and the second top portion 621 can be made a curved structure so that the display element 63 can be applied to a curved tablet computer. The center of the circle of the curved structure of the first top portion 611 and second top portion 621 of this embodiment is located on the side of the bottom surface B of the first top portion 611, so that the curved structure is curved towards the direction of the opposite side of the bottom surface B. Favorably, the curvature radiuses of the first top portion 611 and second top portion 621 are in a range between 10 mm and 1000 mm. In other embodiments, as shown in FIG. 6B, which is a schematic diagram of another embodiment of the display device in FIG. 6A, oppositely, the curved structure of the first top portion 611*a* and second top portion 621*a* may be curved towards the direction of the side of the bottom surface B.

Since the first top portion 611 (611*a*), the first sidewall portion 612 (612*a*), the second top portion 621 (621*a*) and the second sidewall portion 622 (622*a*) also collectively form the first bent portion 613 and the second bent portion 623, the anti-water/oxygen effect also can be achieved and a narrow border can be provided.

Summarily, in the display device of this invention, the first bent portion is formed between the first top portion and the first sidewall portion and the second bent portion is formed between the second top portion and the second sidewall portion, and that is, the first bent portion and the second bent portion collectively form the bent structure. Thereby, the path of the water/oxygen of the environment permeating the accommodating space can be elongated, and that is, the time of the water/oxygen of the environment contacting the display element can be delayed, so as to prevent the display element from being affected by the water/oxygen and damaged and thus to achieve the anti-water/oxygen effect. Besides, through the design of the first bent portion and the second bent portion, the width of the border of the display device can be reduced and the effect of a narrow border region can be provided.

Furthermore, through the design of the first bent portion and the second bent portion, the anti-water/oxygen effect of a certain degree can be achieved when the packaging material is just disposed in the accommodating space and corresponding to the first sidewall portion and the second sidewall portion. Therefore, the packaging material can be saved.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display device, comprising:
 a first substrate including:
  a first top portion;
  a first sidewall portion;
  a first bent portion extended from an edge of the first top portion and disposed between and connecting the first top portion and the first sidewall portion; and
  a first extension portion connected to the first sidewall portion;
 a second substrate separated from the first substrate by a predetermined distance to form an accommodating space and including:
  a second top portion disposed corresponding to the first top portion;
  a second sidewall portion;
  a second bent portion extended from an edge of the second top portion and disposed between and connecting the second top portion and the second sidewall portion; and a second extension portion connected to the second sidewall portion and disposed corresponding to the first extension portion, wherein the first extension portion and the second extension portion are extended along a direction parallel to the first top portion;

a display element disposed in the accommodating space;

a packaging material disposed in the accommodating space and corresponding to the first sidewall portion and the second sidewall portion;

a third bent portion extended from the first sidewall portion and disposed between the first sidewall portion and the first extension portion; and a fourth bent portion extended from the second sidewall portion and disposed between the second sidewall portion and the second extension portion;

wherein the first extension portion is extended to another edge of the first top portion, and the second extension portion is extended to another edge of the second top portion;

wherein the packaging material includes a first packaging material and a second packaging material, the extensibility of the first packaging material is greater than that of the second packaging material, the first packaging material is disposed in the accommodating space and corresponding to the first bent portion, the first sidewall portion, the third bent portion, the second bent portion, the second sidewall portion and the fourth bent portion, and the second packaging material is disposed in the accommodating space and corresponding to the first extension portion and the second extension portion.

2. The display device as recited in claim 1, wherein the packaging material is disposed around the display element.

3. The display device as recited in claim 1, wherein the length of the second sidewall portion is in a range between 1 mm and 20 mm.

4. The display device as recited in claim 1, wherein the first top portion and the second top portion are curved structures.

5. The display device as recited in claim 4, wherein the curvature radiuses of the first top portion and second top portion are in a range between 10 mm and 1000 mm.

6. A display device, comprising:
a first substrate including:
a first top portion;
a first sidewall portion;
a first bent portion extended from an edge of the first top portion and disposed between and connecting the first top portion and the first sidewall portion; and a first extension portion connected to the first sidewall portion;

a second substrate separated from the first substrate by a predetermined distance to form an accommodating space and including:
a second top portion disposed corresponding to the first top portion;
a second sidewall portion;
a second bent portion extended from an edge of the second top portion and disposed between and connecting the second top portion and the second sidewall portion; and
a second extension portion connected to the second sidewall portion and disposed corresponding to the first extension portion, wherein the first extension portion and the second extension portion are extended along a direction parallel to the first top portion;

a display element disposed in the accommodating space;

a packaging material disposed in the accommodating space and corresponding to the first sidewall portion and the second sidewall portion;

a third bent portion extended from the first sidewall portion;

a fourth bent portion extended from the second sidewall portion;

a fifth bent portion extended from the third bent portion; and a sixth bent portion extended from the fourth bent portion;

wherein the third bent portion and the fifth bent portion are disposed between the first sidewall portion and the first extension portion, and the fourth bent portion and the sixth bent portion are disposed between the second sidewall portion and the second extension portion.

7. The display device as recited in claim 6, wherein the packaging material is disposed around the display element.

8. The display device as recited in claim 6, wherein the first extension portion is extended to another edge of the first top portion, and the second extension portion is extended to another edge of the second top portion.

9. The display device as recited in claim 8, wherein the length of the second sidewall portion is in a range between 1 mm and 20 mm.

10. The display device as recited in claim 6, wherein the first top portion and the second top portion are curved structures.

11. The display device as recited in claim 10, wherein the curvature radiuses of the first top portion and second top portion are in a range between 10 mm and 1000 mm.

* * * * *